(12) United States Patent
Hinterecker et al.

(10) Patent No.: US 11,452,234 B2
(45) Date of Patent: Sep. 20, 2022

(54) DEVICE FOR COOLING HIGH-PERFORMANCE COMPUTERS OR HIGH-PERFORMANCE CIRCUITS, WITH TEMPERATURE CONTROL

(71) Applicants: Claus Hinterecker, Vienna (AT); Christian Raunegger, Munich (DE)

(72) Inventors: Claus Hinterecker, Vienna (AT); Christian Raunegger, Munich (DE)

(*) Notice: Subject to any disclaimer, the term of this patent is extended or adjusted under 35 U.S.C. 154(b) by 7 days.

(21) Appl. No.: 17/273,245

(22) PCT Filed: Sep. 2, 2019

(86) PCT No.: PCT/AT2019/000027
§ 371 (c)(1),
(2) Date: Mar. 3, 2021

(87) PCT Pub. No.: WO2020/047565
PCT Pub. Date: Mar. 12, 2020

(65) Prior Publication Data
US 2022/0124941 A1    Apr. 21, 2022

(30) Foreign Application Priority Data
Sep. 4, 2018 (AT) .................................. A 272/2018

(51) Int. Cl.
*H05K 7/20* (2006.01)
*G06F 1/20* (2006.01)

(52) U.S. Cl.
CPC ......... *H05K 7/20236* (2013.01); *G06F 1/206* (2013.01); *H05K 7/20263* (2013.01); *H05K 7/20272* (2013.01); *H05K 7/20281* (2013.01)

(58) Field of Classification Search
CPC ........... H05K 7/20236; H05K 7/20263; H05K 7/20272; H05K 7/20281; H05K 7/20763;
(Continued)

(56) References Cited

U.S. PATENT DOCUMENTS

2006/0065000 A1* 3/2006 Belady ................. H05K 7/2079
62/407
2014/0085823 A1* 3/2014 Campbell .......... H05K 7/20236
361/689

(Continued)

FOREIGN PATENT DOCUMENTS

EP      3236727      10/2017
EP      3279765      2/2018

OTHER PUBLICATIONS

International Search Report and Written Opinion issued in Application No. PCT/AT2019/000027 dated Dec. 5, 2019.

*Primary Examiner* — Abhishek M Rathod
(74) *Attorney, Agent, or Firm* — Workman Nydegger

(57) ABSTRACT

A device and a method for cooling one or several high-performance computers or circuits located in one or more housings and including a dual-circuit cooling system. The high-performance computers or circuits are dipped into a dielectric first cooling liquid in a cuboid basin with a completely fluid-tight configuration and a first cooling circuit with a pump is arranged in the basin for the circulation of the first cooling liquid, with the first cooling liquid being forced to flow through the housings of the high-performance computers or circuits during circulation, thus cooling them. In the basin, a heat exchanger, a forward flow and a return flow of a second cooling circuit with the second cooling liquid are accommodated, and the heat exchanger is dipped into the first cooling liquid and the first liquid is cooled by a second cooling liquid.

12 Claims, 10 Drawing Sheets

(58) Field of Classification Search
CPC ........... H05K 7/20781; H05K 7/20836; H05K 7/2079; G06F 1/206
See application file for complete search history.

(56) References Cited

U.S. PATENT DOCUMENTS

2014/0355202 A1\* 12/2014 Lecourtier ......... H05K 7/20772
　　　　　　　　　　　　　　　　　　165/104.33
2017/0105313 A1\* 4/2017 Shedd ................ H05K 7/20272

\* cited by examiner

DEVICE FOR COOLING HIGH-PERFORMANCE COMPUTERS OR HIGH-PERFORMANCE CIRCUITS, WITH TEMPERATURE CONTROL

The present application is a U.S. National Stage of International Application No. PCT/AT2019/000027, filed on Sep. 2, 2019, designating the United States and claiming the priority of Austrian Patent Application No. A272/2018 filed with the Austrian Patent Office on Sep. 4, 2018. All of the aforementioned applications are incorporated herein in their respective entireties by this reference.

The invention relates to a device for cooling high-performance computers or circuits (2) in a dual-circuit cooling system, the device being arranged within a leak-proof basin (1).

In this regard, high-performance computers or circuits (2) are understood to be any type of computers, electrical or electronic circuits, ASIC chips, CPUs, CPU rigs, crypto mining computers, miners, printed circuit boards, boards and the like.

The high-performance computers or circuits (2) to be cooled are predominantly crypto mining computers equipped with ASIC chips or specific CPU and GPU rigs.

They serve for the generation of crypto currencies, wherein the principle of Proof of Work (PoW), which is employed for this purpose, requires large computing powers that are needed for calculating the blockchain.

A crypto currency, or simply crypto money, is a digital means of payment that is established (e.g., by mining) and transferred using the principles of cryptography, whereby a decentralized and secure payment system can be implemented.

The high-performance computers or circuits (2) used for this generally have a very compact housing (11), which, usually, is rectangular-shaped and resembles a tubular profile and has to be cooled. For this purpose, the housing (11) is usually cooled by one or several server fans, with a gaseous medium, generally air, flowing through the housing for cooling it.

Since the high-performance computers or circuits (2) have a very high computing power, they generate a large amount of heat during operation, often a few hundred watts/litre of volume of the high-performance computer or circuit (2), which has to be dissipated from the housing (11) in order to prevent the high-performance computers or circuits (2) from overheating.

The produced heat thus limits the performance of the high-performance computers or circuits (2) and the environment of the high-performance computers or circuits (2) must be cooled with enormous effort. Therefore, such high-performance computers or circuits (2) are often operated at locations in very cold climatic zones, since the heat generated there can be dissipated more efficiently.

The spatial requirement of such high-performance computers or circuits (2), which are operated in air-cooled data centres, is also very large for them to be ventilated adequately.

Such disadvantages are eliminated by the present invention according to the present claims, since an operation of the high-performance computers or circuits (2) in a liquid-cooled basin, on the one hand, allows a significantly more efficient cooling, and, on the other hand, the dissipated waste heat can be used for other purposes, e.g., for heating purposes and the like, and does not have to be released into the ambient air in a futile fashion.

Suitable liquids into which high-performance computers or circuits (2) are dipped are electrically non-conductive liquids, dielectric liquids, such as, e.g., special oils.

Due to the more efficient heat dissipation, the high-performance computers or circuits (2) can also be operated with significantly higher clock rates and without overheating by means of overclocking.

Furthermore, the high-performance computers or circuits (2) cooled according to the invention can also be operated space-efficiently in ISO containers (as per ISO standard 668).

Furthermore, an almost noiseless, dust-free and maintenance-free operation is possible in any climatic zone, i.e., also in very warm climatic zones.

There are several methods of cooling computers, graphics cards or also special-purpose computers using dielectric liquids. In all those methods, the computers to be cooled are either dipped into the liquid, individual components are cooled using a heat pipe, or they are connected to a separate closed cooling circuit. Those methods of cooling have the drawback that they ensure only a relatively small cooling capacity.

It is the object of the invention to provide a cooling system which allows the cooling capacity to be substantially increased in comparison to conventional liquid coolers. This is achieved by claims 1-19.

The device according to the invention for cooling is adapted to the specific design of high-performance computers or circuits (2) and thus achieves a significant improvement in the cooling capacity of all crypto mining computers available on the market.

However, with the present invention, it is also possible to efficiently cool high-performance computers or circuits (2) without the specific design of crypto mining computers or, respectively, without an enclosure.

For this purpose, the housings (11) of the high-performance computers or circuits (2) are simply omitted, and the latter are cooled directly in a liquid bath or, respectively, in a basin (1) filled with liquid.

A few exemplary embodiments of the invention are explained in further detail with reference to FIGS. 1 to 10:

Figure 1:
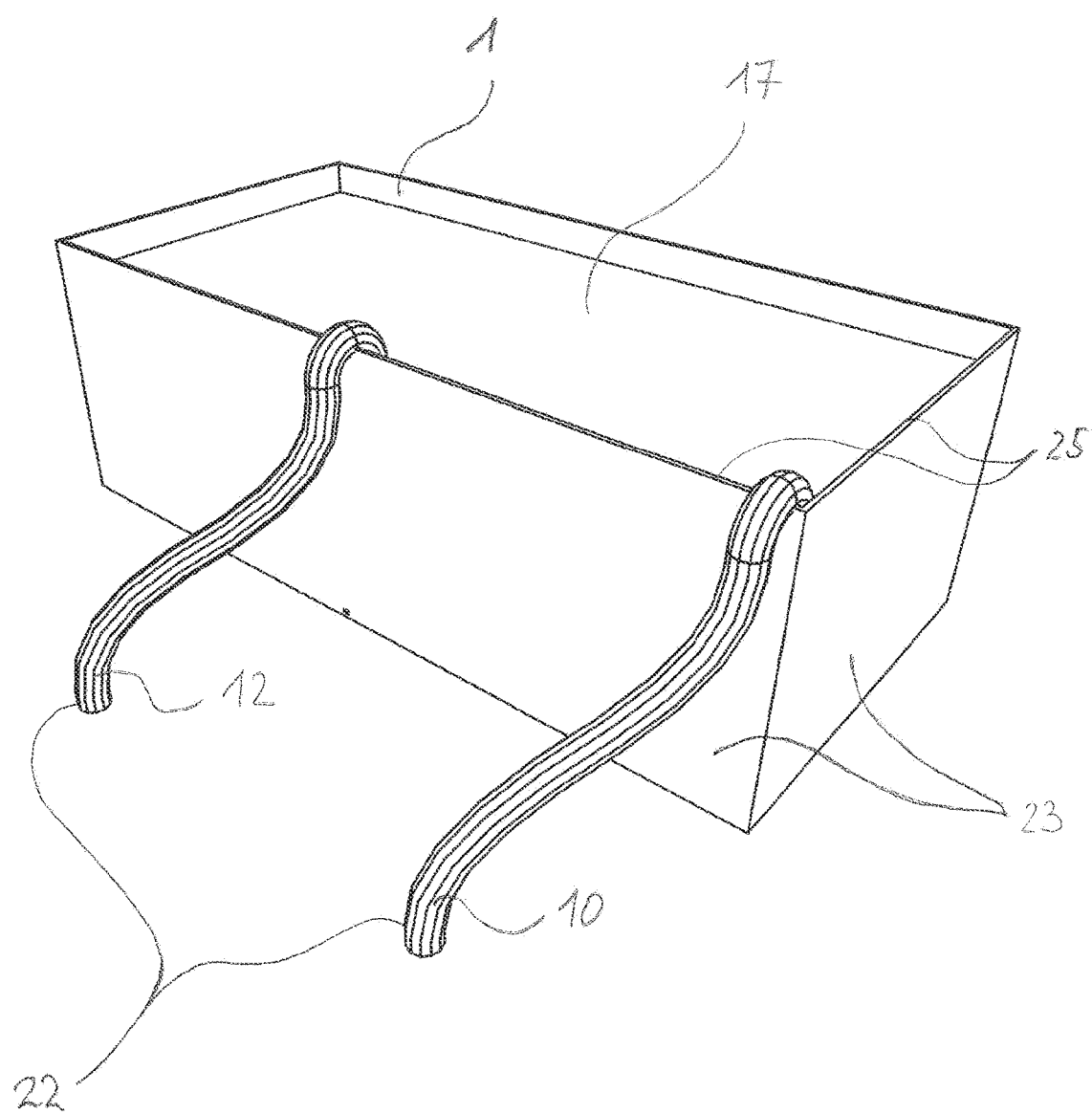
FIG. 1 shows a leak-proof basin (1) preferably filled to capacity with a dielectric first cooling liquid (17) and comprising conduits (22) for the forward flow (12) and the return flow (10) of a heat exchanger (13), the conduits (22) being guided across the basin edge of the leak-proof basin (1).
Figure 2:
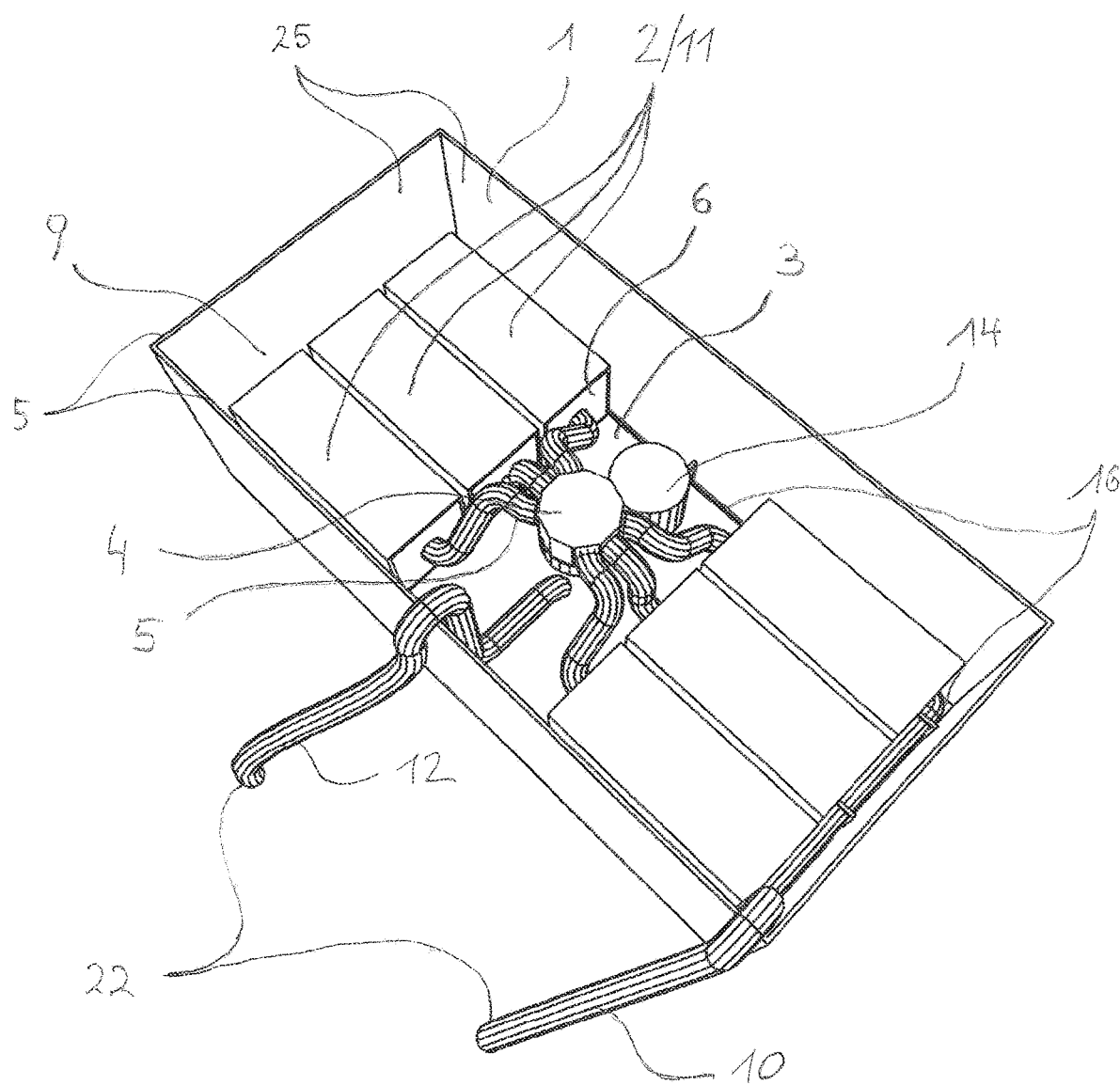
FIG. 2 shows one or, respectively, several housings (11) for high-performance computers or circuits (2), which are dipped completely or perhaps partially into the dielectric first cooling liquid (17).
Figure 3:
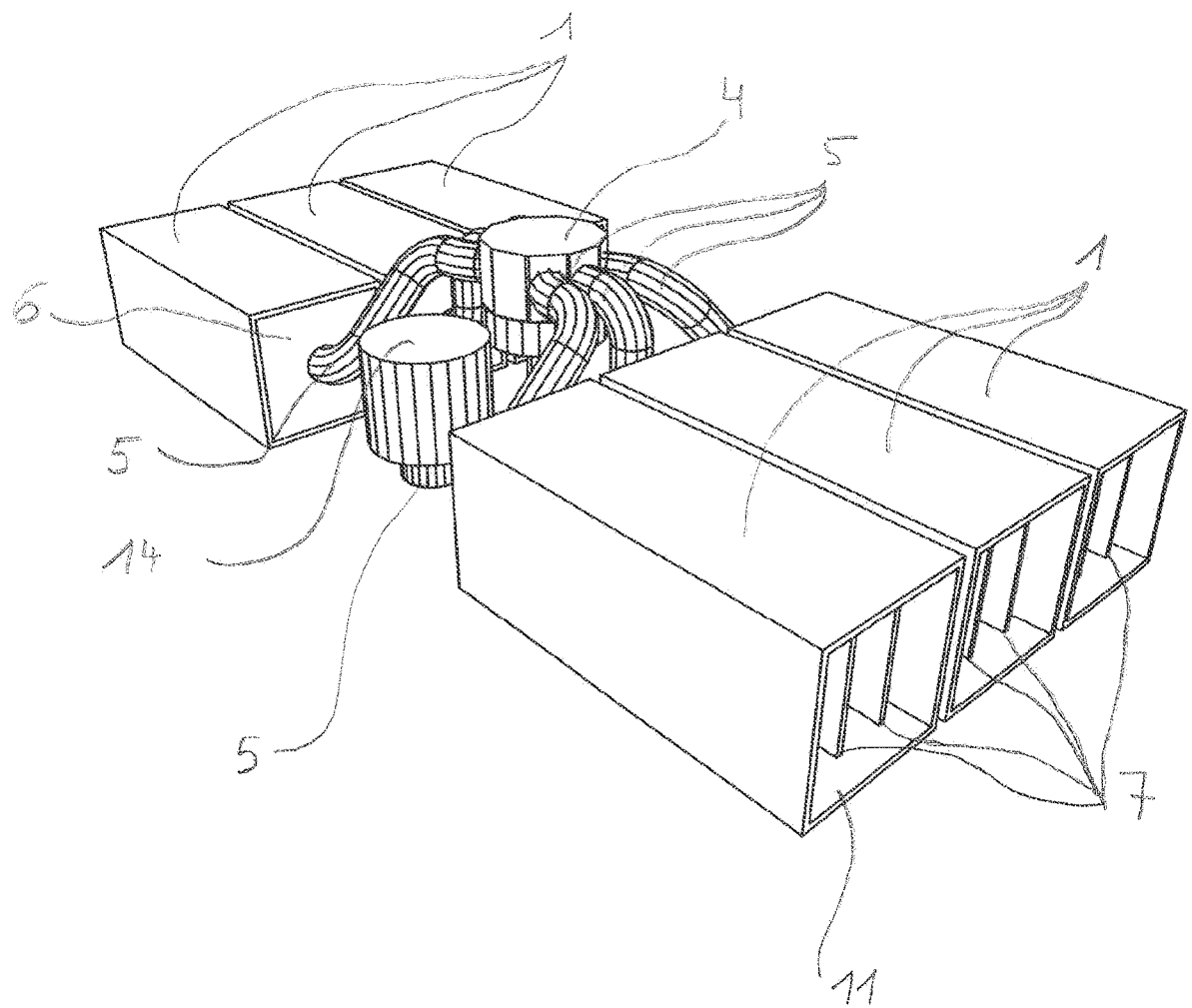
FIG. 3 shows the housings (11) of the high-performance computers (2) to be cooled, which can be charged with a liquid cooling medium via a distributor (4) and a line connector (5) and a connection adapter (6) by means of a pump (14).
Figure 4:
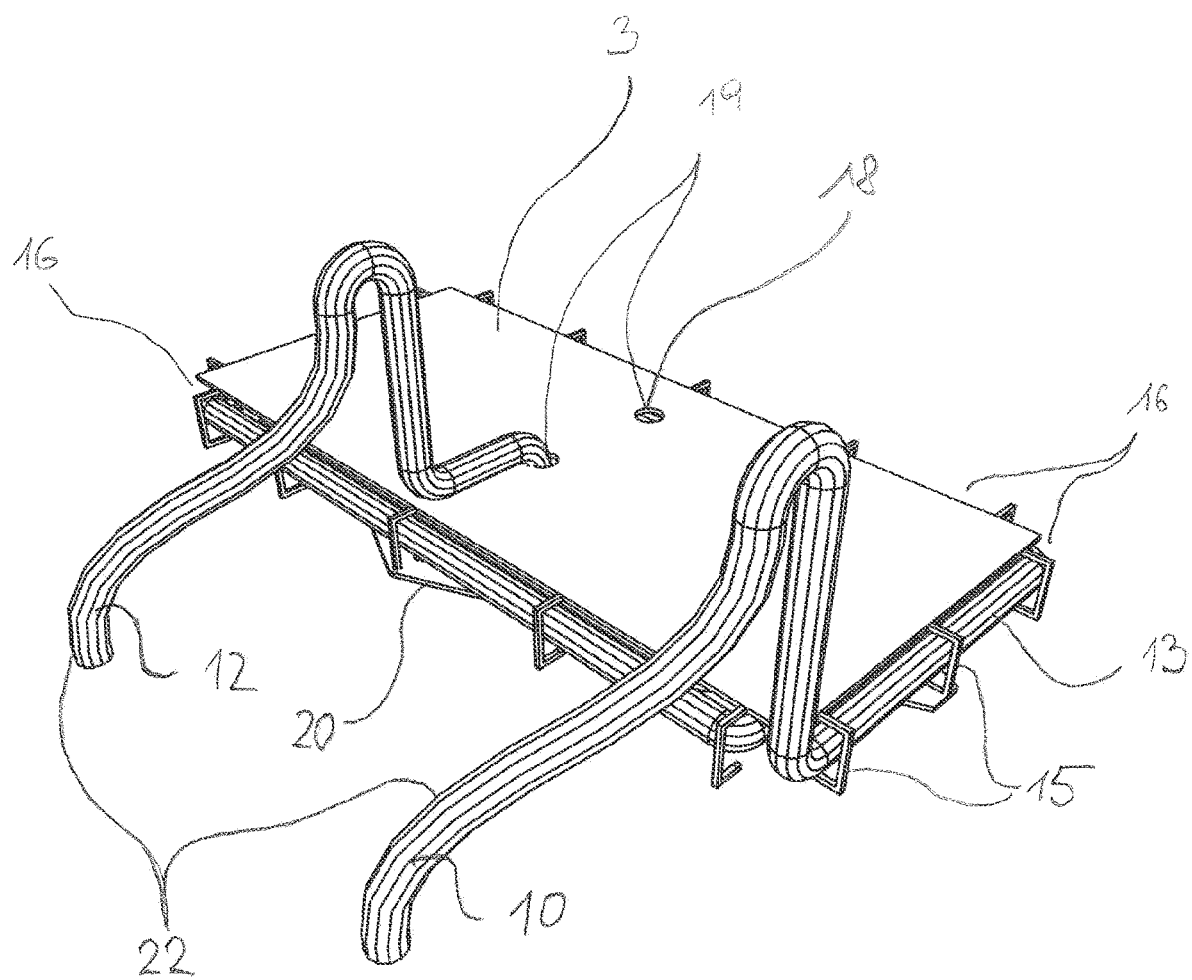
FIG. 4 shows an intermediate floor (3) on which the housings (11) of the high-performance computers or circuits (2) can be positioned, as well as feet (15) for the intermediate floor and a forward flow (12) and a return flow (10) of a heat exchanger (13). The feet (15) simultaneously form a holder (20) for a heat exchanger (13).
Figure 5:
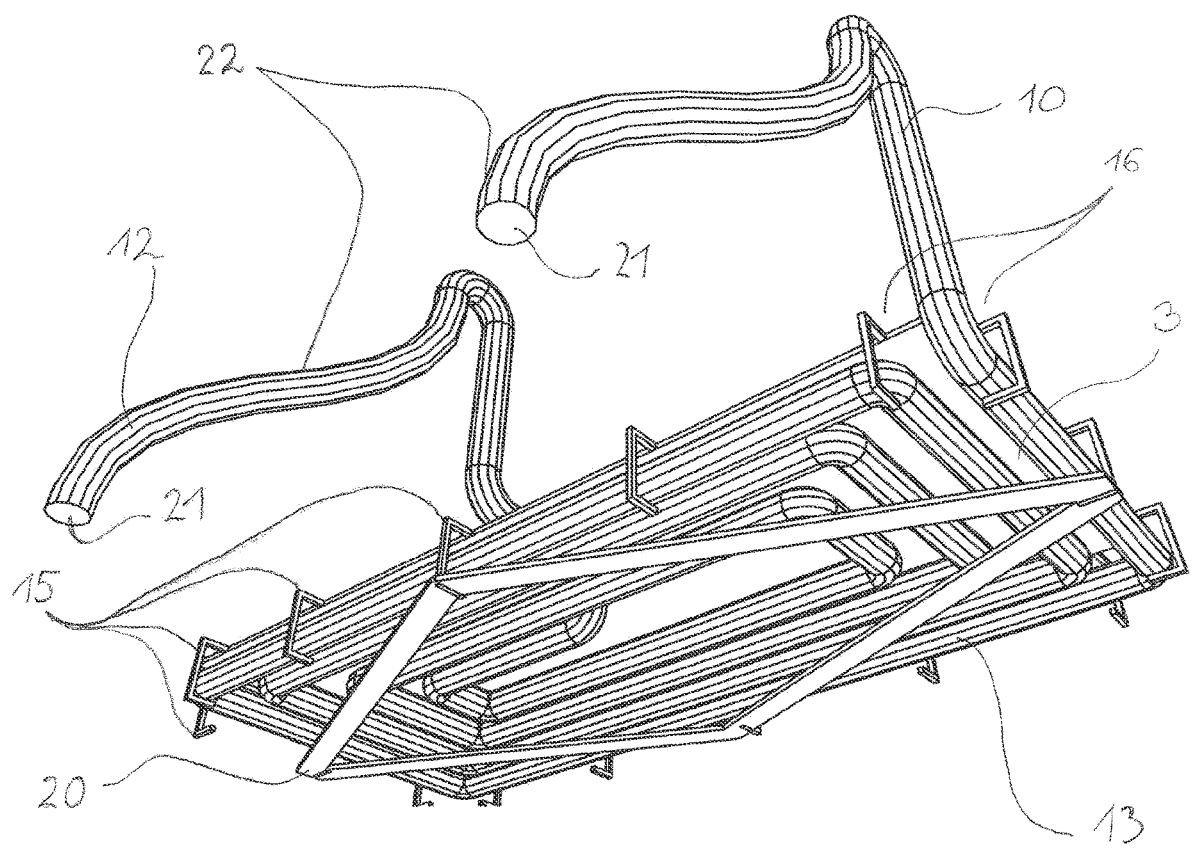
FIG. 5 shows the intermediate floor (3) with the feet (15) from below and a heat exchanger (13) with its forward flow (12) and return flow (10).
Figure 6:
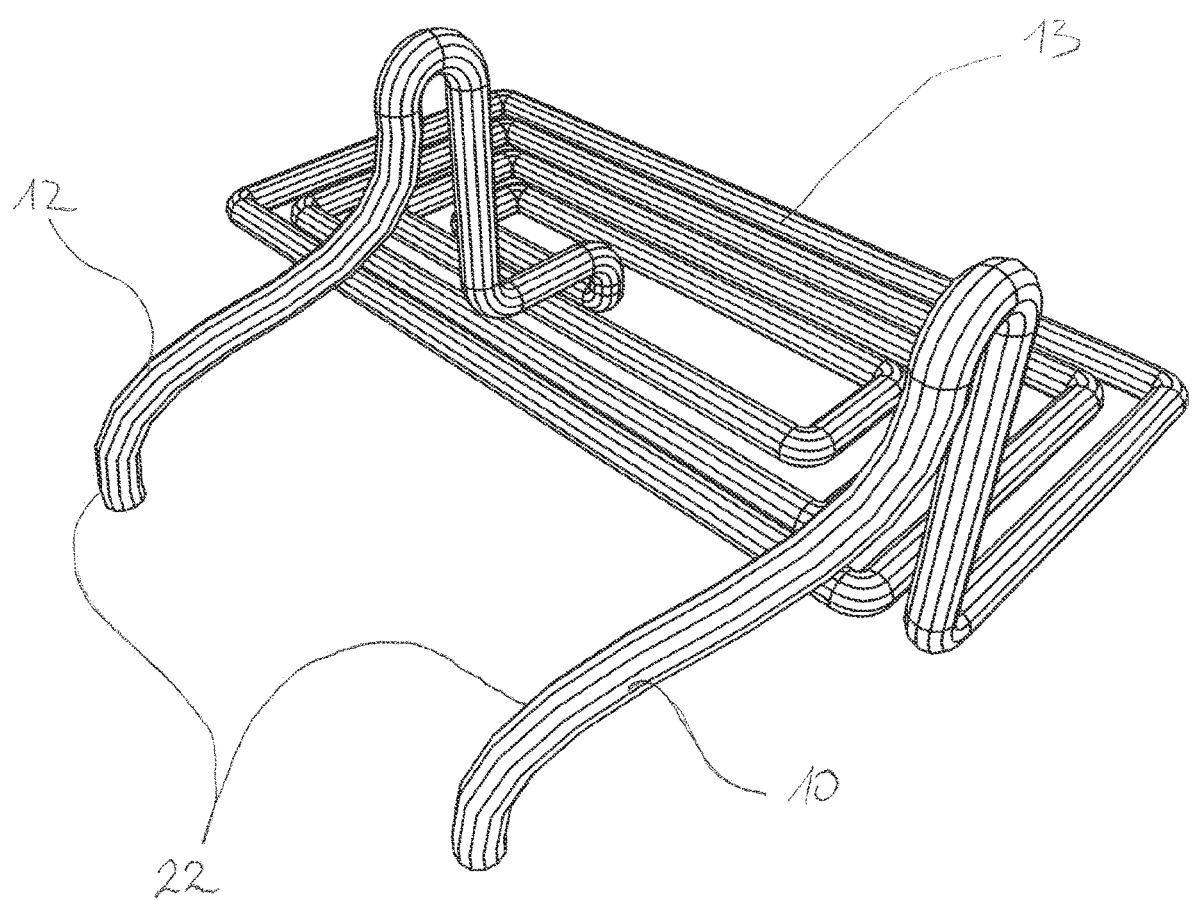
FIG. 6 shows the heat exchanger (13) with a forward flow (12) and a return flow (10).
Figure 7:
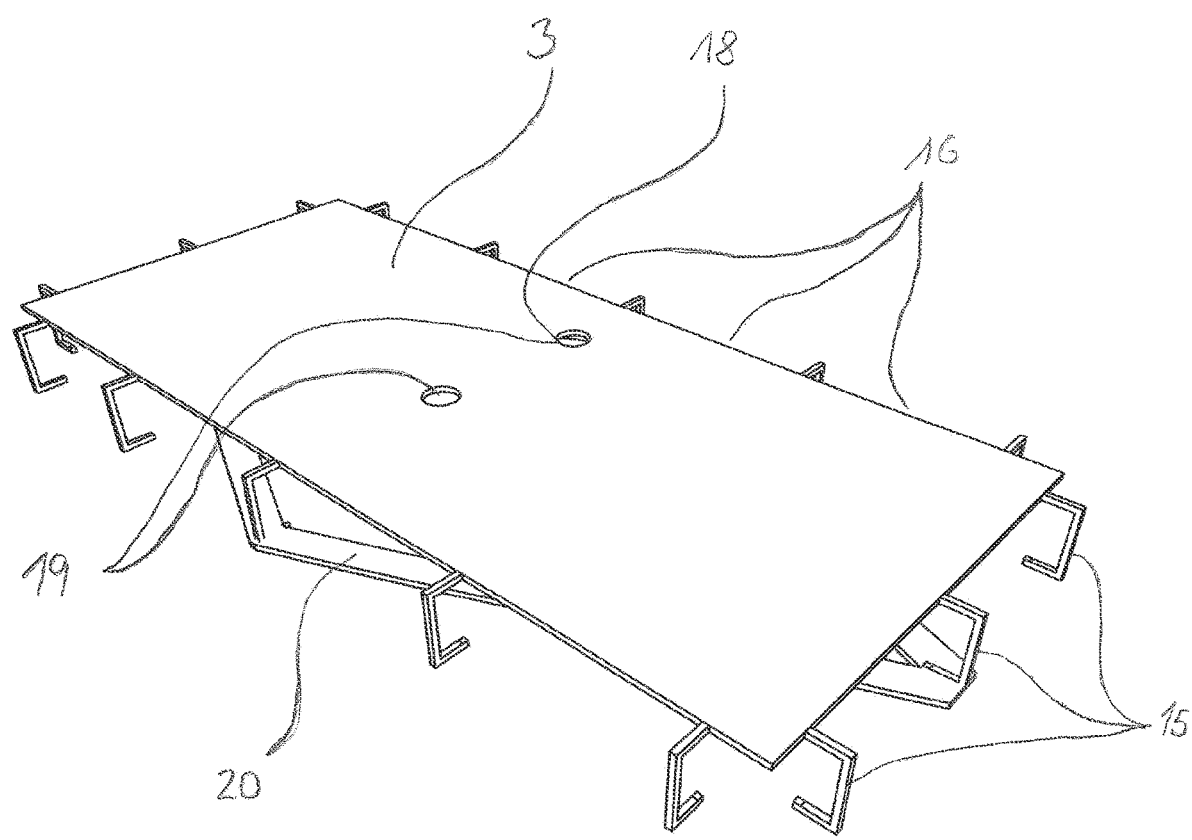
FIG. 7 shows the intermediate floor (3) with the recesses (16) and the feet (15).
Figure 8:
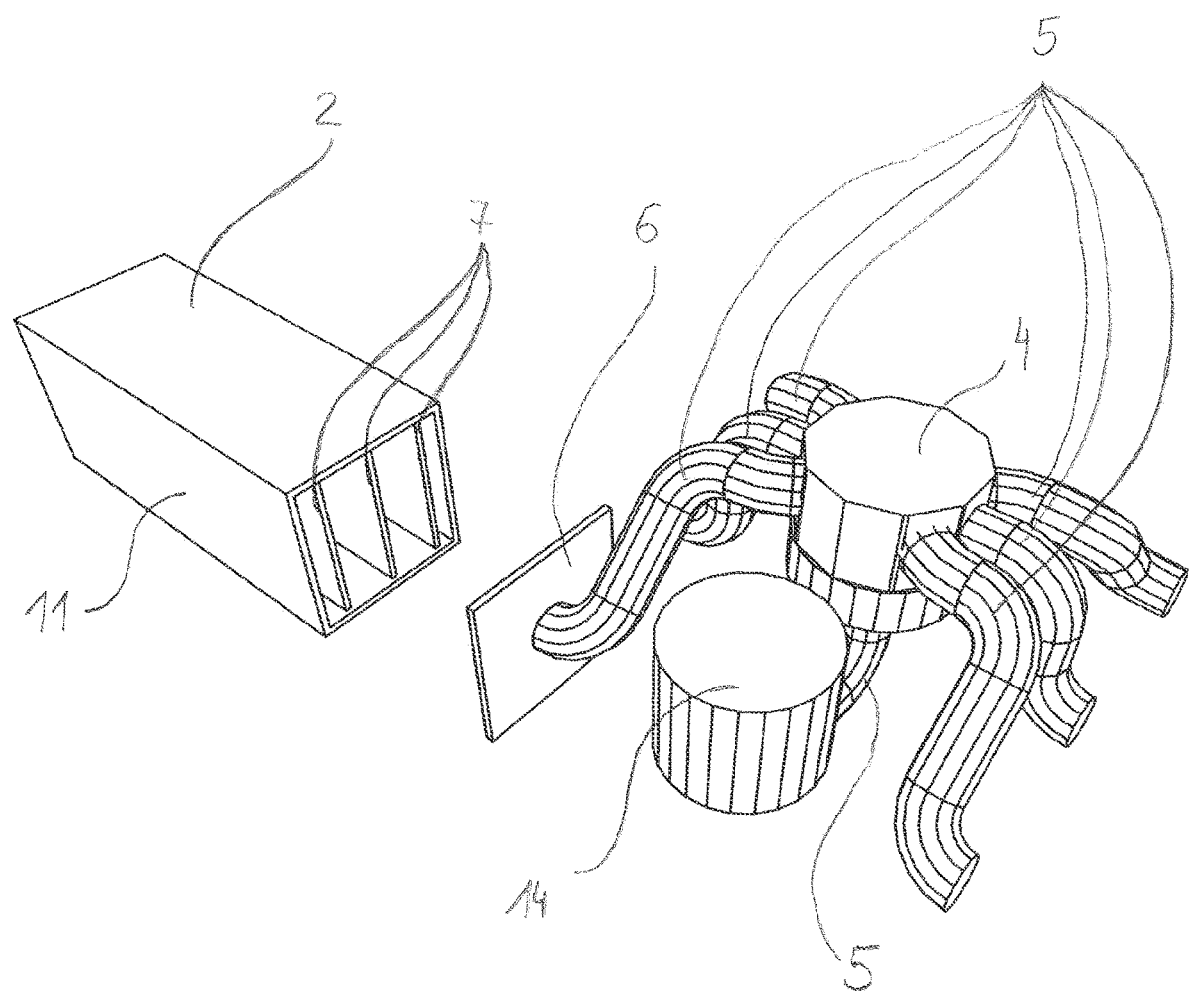
FIG. 8 shows a pump (14), a distributor (4) and a connection adapter (6) each connected to a line connector (5), as well as a housing (11) with boards (7) or, respectively, circuit boards located therein.
Figure 9:
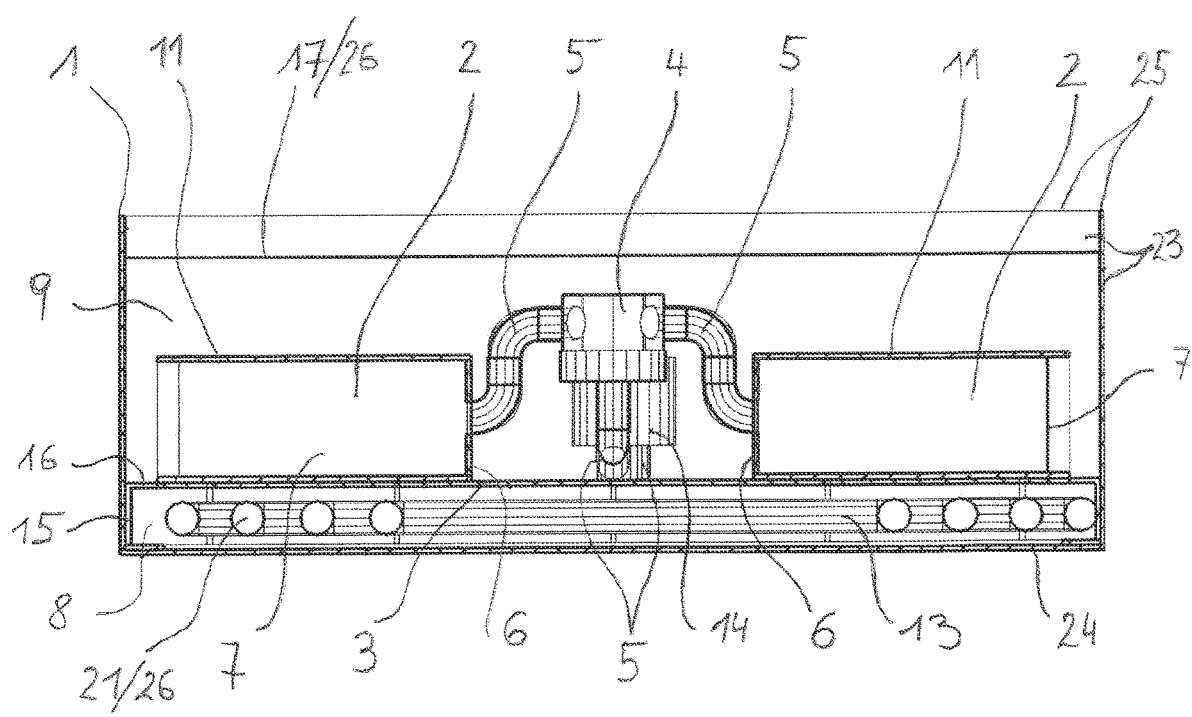
FIG. 9 shows a sectional view of the basin (1) with an intermediate floor (3), a distribution system composed of a distributor (4), a line connector (5), a connection adapter (6) and housings (11) of the high-performance computers or circuits (2) to be cooled.
Figure 10:
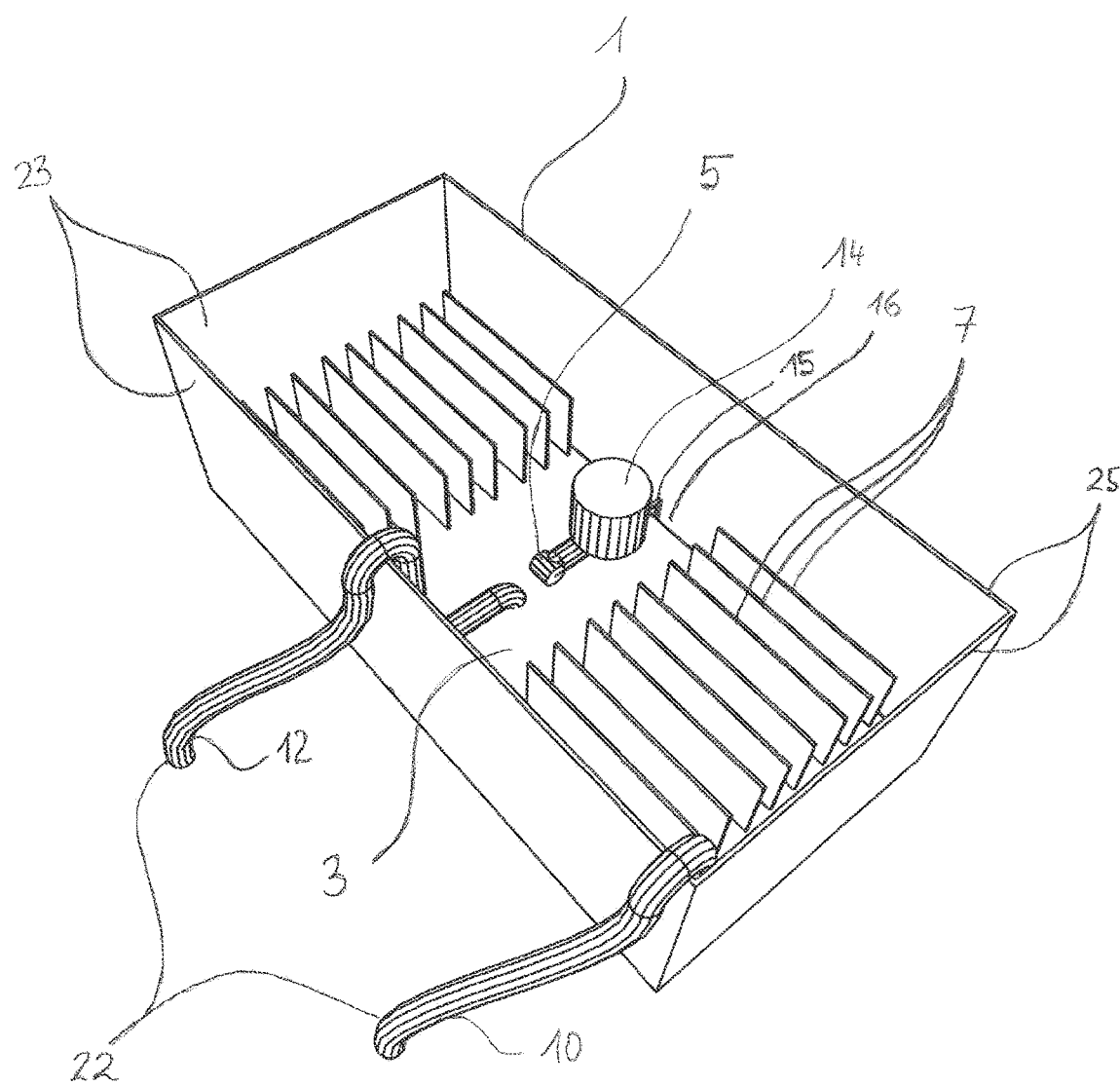
FIG. 10 shows an oblique view of the basin (1) in which the boards (7) of the high-performance computers or circuits (2) without a housing (11) are placed on an intermediate floor (3).

The invention relates to a device for cooling one or several high-performance computers or circuits (2) preferably located in (a) housing(s) (11) and comprising a dual-circuit cooling system, wherein the high-performance computers or circuits (2) are dipped into an, in particular, dielectric first cooling liquid (17) in a preferably cuboid basin (1) with a completely fluid-tight design.

A first cooling circuit with a first cooling medium, preferably a first cooling liquid (17), particularly preferably a dielectric cooling liquid, in particular oil, is accommodated in the basin (1). A first cooling liquid (17) is circulated in the basin by means of a pump (14), with the first cooling liquid (17) being forced to flow through the housings (11) of the high-performance computers (2) during circulation, thus cooling them.

In the basin (1), a heat exchanger (13), a forward flow (12) and a return flow (10) of a second cooling circuit with the second cooling liquid (21) are accommodated, wherein the heat exchanger (13) is dipped into the first cooling liquid (17) and the first liquid (17) is cooled by means of a second cooling liquid (21).

The basin (1) is designed as a leak-proof basin in a fluid-tight manner. In particular, the basin has a full-walled or double-walled design, wherein the wall and floor surfaces of the basin do not have any openings or apertures. This enables that, in the event of malfunctions in the apparatus, the first cooling liquid (17) remains in the basin and cannot escape from it. An undesired leak of this first cooling liquid (17) from the basin (1) can thus be avoided or prevented. In this way, the immediate surroundings of the basin (1) and, respectively, the environment are protected from soiling or, respectively, contamination even in the event of undesired malfunctions in the basin (1) or when the high-performance computer (2) is in operation.

The basin (1) is made of an acid- and/or oil-resistant material, in particular metal, particularly preferably stainless steel. However, it may also be made of a synthetic material, polyester or a similar material.

An insert-like intermediate floor (3) is introduced into the basin (1) and can preferably be lifted into the basin (1) from above.

This intermediate floor (3) divides the basin (1) into two areas, in particular a floor space (8) located below and a main space (9) located in particular above the floor space (8).

The intermediate floor (3) as an insert is provided with one or several feet (15), whereby the intermediate floor (3) forms a second bearing surface spaced apart from the bottom of the basin (1), on which at least parts of the apparatus can be attached.

The intermediate floor (3) is provided with feet (15) which are arranged or, respectively, attached in particular in the edge regions of the intermediate floor (3). Slot-like openings or, respectively, recesses (16) are thus formed between the edges (25) of the basin (1) and the edges of the intermediate floor (3). This enables the first cooling liquid (17) located in the basin (1) to flow freely from the main space (9) to the floor space (8) through those slot-like recesses (16).

Furthermore, the intermediate floor (3) comprises one or several bore-like apertures (19) which allow the first cooling liquid (17) to flow back from the floor space (8) to the main space (9). In particular, said aperture(s) (19) can be connected to line connectors (5) leading to one or several pumps (14).

A holder (20) for a heat exchanger (13) arranged in particular in the floor space (8) is provided preferably underneath the intermediate floor (3).

The heat exchanger (13) is part of a second cooling circuit comprising a second cooling medium, preferably a second cooling liquid (21), particularly preferably water.

The second cooling circuit is composed, in addition to the heat exchanger (13), also of conduits (22), in particular a supply line or, respectively, a forward flow (12) and a discharge line or, respectively, a return flow (10), with those conduits (22) being guided from the heat exchanger (13) toward the outside of the basin (1).

In order to ensure absolute tightness of the basin (1), those conduits (22) are, in this case, not passed through the walls (23) or the floor (24) of the basin (1), but preferably run across at least one of the edges (25) of the basin (1). In doing so, the forward flow and the return flow do not break through the walls of the basin (1) at any point.

The first cooling circuit, which is arranged only inside the leak-proof basin (1), is composed of a suction hole (18) in the intermediate floor (3), from where the first cooling liquid (17) is sucked in by a pump (14) and is conveyed via tubular line connectors (5) to a distributor (4) for the first cooling liquid.

The first cooling liquid (17) is then distributed from the distributor (4) to one or several further line connectors (5) which lead to connection adapters (6).

The connection adapters (6) are attached to the housing or housings (11) of the high-performance computers or circuits (2) at their inlet side. In this case, the conventionally provided fans of the high-performance computers or circuits (2) have been replaced by the connection adapters (6).

The first cooling liquid (17) thus flows through the housings (11) of the high-performance computers or circuits (2), cools their circuits or, respectively, boards (7) and exits the housings in a heated state.

Alternatively, the circuits or, respectively, the boards (7) may be cooled also without an existing housing (11), in which case both the housings (11) and the connection adapters (6) can be omitted.

In this case, the individual boards (7) of the high-performance computers or circuits (2) are freely positioned in the basin (1) on the intermediate floor (3) and are covered by dielectric liquid.

The use of the distributor (4), the line connectors (5) and the connection adapters (6) can then also be omitted, and the pump (14) then causes the dielectric first liquid (17) to flow freely in the area of the boards (7) above the intermediate floor (3). Thereafter, the heated liquid passes through the recesses (16) at the edges (25) of the basin (1) into the floor space (8) toward the heat exchanger (13).

The pump (14) and the housing or housings (11) of the high-performance computers or circuits (2) are positioned or, respectively, attached on the intermediate floor (3).

In the intermediate floor (3), at least one suction hole (18) is provided, from which a tubular line connector (5) leads to the pump (14).

All line connectors (5) are designed with the same overall length so that the cooling medium is conveyed in all line connectors (5) with the same pressure loss and also the same volume flow. In this way, it is ensured that the first cooling liquid (17) flows through all housings (11) of the high-performance computers or circuits (2) in the same way, thus cooling them. After exiting the housings (11) of the high-performance computers or circuits (2), the first cooling liquid (17) flows back into the floor space (8) via the slot-shaped openings provided between the edges of the basin (1) and the intermediate floor (3) and returns to the suction hole (18) of the pump (14) via the heat exchanger (13).

The heat exchanger (13), the distributor (4) and the line connectors (5) are preferably manufactured from a dense, pliable and flexible tubular material, particularly preferably from a corrugated pipe, particularly preferably from a corrugated stainless steel pipe. However, those components may also be made of another metallic material or a synthetic material.

The forward flow (12) and the return flow (10) as well as the heat exchanger (13) itself are preferably constructed from a corrugated stainless steel pipe in a pressure-resistant way, but can also be constructed from other metals such as aluminium, copper with or without fins, pressure-resistant synthetic materials, etc.

A pump (14) sucks the dielectric liquid (17) from a suction hole (18) in the intermediate floor (3) out of the floor space (8) and channels it evenly into the high-performance computers or circuits (2) via a distributor (4), distributor pipes (5) and across connection adapters (6) arranged at the housings of the computers. As it flows through the housings, the dielectric first cooling liquid (17) heats up. The heated dielectric first cooling liquid (17), in particular oil, flows back into the floor space (8) of the leak-proof basin (1) through recesses (16) preferably located laterally in the intermediate floor (3) after it has emerged at the rear ends of the high-performance computers or circuits (2). In the floor space (8), a heat exchanger (13) is arranged, which is provided with a forward flow line and a return flow line. With the forward flow (12) and the return flow (10), the heat exchanger (13) forms a second cooling circuit, which cools the dielectric first cooling liquid (17) in the floor space (8) of the leak-proof basin (1). The second cooling circuit with the second cooling liquid (21) is usually charged with water and conveys the heat of the high-performance computers or circuits (2) across the basin edge of the leak-proof basin (1) toward the outside of the basin.

The dielectric first cooling liquid (17) cooled in this way can be sucked back in by the pump (14) and can be fed back to the high-performance computers or circuits (2).

According to the invention, almost all of the heat emerging in the high-performance computers or circuits (2) can thereby be transferred to the second cooling liquid (21) and is thus carried away from the leak-proof basin (1). Said heat can then be used as required, e.g., for heating purposes, e.g., for residential heating or house heating, or for commercial heating or water heating (indoor swimming pools, breweries, greenhouses and the like).

Particular advantages of the invention are that:
the dual-circuit cooling system has a compact design for the cooling of high-performance computers or circuits (2),
the leak-proof basin (1) has a leak-proof design as a collecting tray,
therefore, there is no risk of environmental pollution,
the dielectric first cooling liquid (17) or, respectively, the oil remains in the leak-proof basin (1) even in the event of a malfunction,
external heat exchangers are not required,
a quiet operation is enabled due to the removal of the fans of the high-performance computers or circuits (2),
a dust-free operation of the high-performance computers or circuits (2) is provided as the high-performance computers or circuits (2) are dipped into a liquid,
extreme overclocking of the high-performance computers or circuits (2) is possible because of the cooling,
the waste heat of the high-performance computers or circuits (2) is not lost, but can be utilized for heating purposes and/or for hot water treatment.

The key element of the cooling system is a particularly rectangular or, respectively, cuboid thick-walled metal or plastic basin, especially a stainless steel basin, which is 100% leak-proof as it has neither openings, nor inlets and outlets.

The basin (1) made of a metal or, respectively, synthetic material is designed as a collecting tray with a wall thickness of at least 2 mm so that it can be classified as leak-proof.

An intermediate floor (3) is inserted inside the basin (1), the intermediate floor resting on one or several feet (15) and also simultaneously forming a holder (20) for a heat exchanger (13).

The intermediate floor (3) with the feet (15) and the holder (20) is preferably made and welded from stainless steel. However, those parts may also be manufactured from other metals or materials such as synthetic materials or carbon fibres, etc. The production can be effected by welding, soldering, riveting, gluing and the like.

LIST OF REFERENCE SYMBOLS 1 basin
2 high-performance computers or circuits
3 intermediate floor
4 distributor
5 line connector
6 connection adapter
7 boards
8 floor space
9 main space
10 return flow
11 housing
12 forward flow
13 heat exchanger
14 pump
15 feet
16 recesses
17 first cooling liquid
18 suction hole pump
19 aperture
20 holder
21 second cooling liquid
22 conduits
23 walls
24 floor
25 edges
26 temperature sensor

The invention claimed is:
1. A device for cooling one or several high-performance computers or circuits located in one or more housings and comprising a dual-circuit cooling system, wherein the high-performance computers or circuits are dipped into a dielectric first cooling liquid in a cuboid basin with a completely fluid-tight configuration and a first cooling circuit with a pump is arranged in the basin for the circulation of the first cooling liquid, with the first cooling liquid being forced to flow through the housings of the high-performance computers or circuits during circulation, wherein, in the basin, a heat exchanger, a forward flow and a return flow of a second cooling circuit with the second cooling liquid are accommodated, wherein the heat exchanger is dipped into the first liquid and the first cooling liquid is cooled by a second cooling liquid, wherein an insert-like intermediate floor is introduced into the basin and is configured to be lifted into the basin, which intermediate floor divides the basin into a floor space located below and a main space located above the floor space, and the intermediate floor as an insert is provided with one or more feet, with the feet being respectively attached in the edge regions of the intermediate floor, thus forming respective recesses between the edges of the basin and the edges of the intermediate floor so that the first cooling liquid can flow freely from the main space to the floor space through the recesses, and the intermediate floor has one or more bore-like apertures which allow the first cooling liquid to flow back from the floor space to the main space, wherein conduits are connected to the heat exchanger, with those conduits being guided from the heat exchanger toward the outside of the basin without thereby breaking through the walls or the floor of the basin, wherein they are guided particularly preferably across at least one of the edges of the basin, and the pump and the housing or housings of the high-performance computers or circuits are positioned on the intermediate floor, the pump and, respectively, the housings being arranged in the main space of the basin, and at least one suction hole is provided in the intermediate floor, with a tubular line connector leading from the suction hole to the pump and from there further on to a distributor for the first cooling liquid, and further line connectors lead from the distributor to one or several connection adapters, the connection adapters being arranged on the housings of the high-performance computers or circuits at the inlet side.

2. A device according to claim 1, wherein the basin has a full-walled or double-walled design and the wall and floor surfaces of the basin have no openings or apertures.

3. A device according to claim 1, wherein the basin is made of an acid- and/or oil-resistant material.

4. A device according to claim 1, wherein the intermediate floor has a holder for the heat exchanger arranged in the floor space.

5. A device according to claim 1, wherein all line connectors have the same length, with the first cooling medium located in the line connectors so that the pressure loss, and also the volume flow, are the same in all line connectors, so that uniform cooling of all housings is achieved.

6. A device according to claim 1, wherein the heat exchanger, the distributor and the line connectors are made of a dense, pliable and flexible tubular material.

7. A device according to claim 1, wherein the device is operated without a connection adapter so that the first cooling liquid can flow in the main space arbitrarily around the computer boards without housings for cooling the computer boards.

8. A method of cooling of one or several high-performance computers or circuits located in one or more housings, in the cuboid basin having the completely fluid-tight configuration and comprising the insertable intermediate floor which divides the basin into the floor space and the main space, comprising the device for cooling according to claim 1, wherein the first cooling liquid is pumped by the pump from the suction hole in the intermediate floor via the tubular line connector to the distributor, the first cooling liquid is pumped from this distributor via the further line connectors to the one or several connection adapters, which are attached to the housings of the high-performance computers or circuits at the inlet side, that the first cooling liquid is heated as it flows through the housings of the high-performance computers or circuits and the high-performance computers or circuits are thus cooled, that the first cooling liquid emerges from the housings into the main space after having flowed through the housings of the high-performance computers or circuits, with the heated first cooling liquid then flowing from the main space into the floor space via the respective recesses between the edges of the basin and the edges of the intermediate floor, and that the first cooling liquid then flows back to the suction hole of the pump in the intermediate floor via the heat exchanger, with the first cooling liquid giving off its heat to the second cooling liquid which is located in the heat exchanger and is part of the second cooling circuit, and that, with the aid of the second cooling circuit comprising the forward flow, the heat exchanger and the return flow, the heat from the basin is conveyed toward the outside of the basin, wherein the second cooling liquid is guided across at least one edge of the basin during heat removal.

9. A method according to claim 8, wherein a dielectric liquid is used as the first cooling liquid, and water is used as the second cooling liquid.

10. A method according to claim 8, wherein one or more temperature sensors are arranged in the first cooling liquid and in the second cooling liquid, the temperatures of the two cooling liquids being determined with the aid of the temperature sensors.

11. A method according to claim 10, wherein the first cooling liquid is adjusted to a desired target temperature by varying the pump capacity of the pump.

12. A method according to claim 10, wherein the second cooling liquid is adjusted to a desired target temperature by varying the flow rate in the forward flow line of the forward flow or in the heat exchanger.

\* \* \* \* \*